United States Patent
König et al.

[11] Patent Number: 5,496,594
[45] Date of Patent: Mar. 5, 1996

[54] CHEMICAL VAPOR DEPOSITION APPARATUS AND METHOD WHEREIN A CORONA DISCHARGE IS GENERATED INSIDE A PERFORATED CAGE WHICH SURROUNDS THE SUBSTRATE

[75] Inventors: Udo König, Essen, Germany; Hendrikus van den Berg, Venlo-Blerick, Netherlands; Ralf Tabersky, Bottrop, Germany

[73] Assignee: Widia GmbH, Essen, Germany

[21] Appl. No.: 244,689

[22] PCT Filed: Nov. 30, 1992

[86] PCT No.: PCT/DE92/01005

§ 371 Date: Jun. 6, 1994

§ 102(e) Date: Jun. 6, 1994

[87] PCT Pub. No.: WO93/11275

PCT Pub. Date: Jun. 10, 1993

[30] Foreign Application Priority Data

Dec. 5, 1991 [DE] Germany ............... 41 40 158.1

[51] Int. Cl.⁶ ............... H05H 1/24; C23C 16/50
[52] U.S. Cl. ............... 427/569; 118/723 E
[58] Field of Search ............... 427/569, 573, 427/580; 118/723 E; 156/345; 216/71; 313/231.31; 315/111.21; 204/298.06, 298.08

[56] References Cited

U.S. PATENT DOCUMENTS

| 4,633,809 | 1/1987 | Hirose et al. | 118/723 E |
| 4,648,348 | 3/1987 | Fujiyama | 118/723 E |
| 4,676,195 | 6/1987 | Yasui et al. | 118/723 E |

FOREIGN PATENT DOCUMENTS

| 0149408 | 7/1985 | European Pat. Off. . |
| 2251571C3 | 5/1973 | Germany . |
| 3102174 | 12/1981 | Germany . |
| 3102174A1 | 12/1981 | Germany . |
| 3417192A1 | 11/1984 | Germany . |
| 3417192 | 11/1984 | Germany . |
| 3433874A1 | 3/1986 | Germany . |
| 3433874 | 3/1986 | Germany . |
| 3841731 | 4/1990 | Germany . |
| 3841731C1 | 4/1990 | Germany . |
| 3-211726 | 9/1991 | Japan | 118/723 E |

*Primary Examiner*—Terry J. Owens
*Attorney, Agent, or Firm*—Herbert Dubno

[57] ABSTRACT

Apparatus and method for corona-activated chemical vapor deposition. A substrate is positioned in a reaction vessel in all-around spaced relationship from the walls of the vessel. A cage having throughgoing perforations surrounds the substrate and is spaced from the vessel walls and the substrate. A corona discharge is generated along at least an inner surface of the cage by connecting the cage and substrate with a voltage source. A reaction gas mixture is passed through the cage and a coating is formed from the reaction gas mixture on the substrate.

16 Claims, 3 Drawing Sheets

CHEMICAL VAPOR DEPOSITION APPARATUS AND METHOD WHEREIN A CORONA DISCHARGE IS GENERATED INSIDE A PERFORATED CAGE WHICH SURROUNDS THE SUBSTRATE

REFERENCE TO RELATED APPLICATIONS

This application is a national phase of PCT/DE92/01005 filed Nov. 30, 1992 and based, in turn, on German national application P41 40 158.1 of Dec. 5, 1991, under the International Convention.

FIELD OF THE INVENTION

The invention relates to a process for coating substrate bodies with hard substances by using a corona effect activated chemical vapor deposition (hereafter referred to as CVD) process at temperatures above 300° and pressures below 10000 Pa.

Further the invention relates to a device for carrying out the mentioned process with a reactor having at least one gas inlet and at least one gas outlet connected with a pump, and in whose inner space there are one or more substrate bodies and one or more electrodes arranged at a distance therefrom and connected with a voltage source.

BACKGROUND OF THE INVENTION

High-temperature coating processes have the disadvantage that tenacity losses in the composite body consisting of a substrate body and the thereto applied coating of hard substance cannot always be avoided. So, for instance in the case of indexable inserts coated with titanium carbide used in the continuous machining of high-alloy steel, generally a higher degree of wear has been found when the coating was applied by a high-temperature process at approximately 1000°. However at sufficiently low temperatures, such negative effects of the coating process on the substrate body can be avoided. Among the coating processes which can be carried out at low temperatures, besides the PVD process, the plasma-activated CVD process is important. If on the reaction gas in a low-pressure corona effect an unbalanced plasma is superimposed, the charged particles are accelerated under the influence of the existing electric field. Depending on particle density or pressure, the free path length between two impacts is also determined. If the particle energy is sufficient at the applied voltage, molecules or atoms can be excited for dissociation or ionization. In this way chemical reactions become possible which otherwise take place only at relatively high temperatures. The low-pressure plasma can basically be produced by applying a constant direct voltage at a workpiece connected as a cathode, by a high-frequency alternating current or by a pulsed direct voltage.

The high-frequency excitation, wherein the energy can be introduced inductively or capacitively from the outside into the reaction vessel, is often used for the deposition of very pure layers, e.g. in microchips. Since it works with electrodes which are not directly connected with the substrate, it does not matter whether the material itself is conductive or nonconductive. The drawback is that this process is very expensive.

The simplest way to produce a low-pressure discharge is to connect the workpiece as a cathode and to use the vessel or its walls as the anode or ground potential. The temperature of the substrate is thereby a function of the voltage and the current.

Further the direct voltage can be pulsed in which case the substrate temperature is a function of the peak voltage, as well as the peak current and also of the pulse duration and pulse frequency. The advantage of this process is that the coating temperature can be set independently of the parameters of the low-pressure discharge, the voltage and the current.

Basically CVD reactors have to meet two requirements: on the one hand they have to allow the coating of as many substrates as possible, which means they must have a high capacity, on the other hand shading effects or irregular coatings have to be avoided.

With regard to the second above-mentioned requirement it has already been proposed in DE 22 51 571 C3 to circulate the reactive gases in the reactor from the entire marginal area of the substrate support inwards over the substrate support and the substrate bodies supported thereon, from where the gases are then centrally evacuated. In this way a laminar radial flow is meant to be achieved. The reactor has a cover plate which is connected as a first electrode with respect to the substrate receiving plate which is connected as a second electrode. A high-frequency voltage is used for the production of plasma.

In U.S. Pat. No. 4,909,183 at first a dischargeable chamber is described, in whose center a rotatable mounting support or the coating substrate is arranged. The substrate itself is surrounded by a cylindrical cathodic electrode, which is connected with a high-frequency voltage source. The substrate serves as anode, so that when the voltage is applied a low-pressure plasma is produced at the cathode. The disadvantage is that the coating material is deposited not only on the substrate, but also on the cathode, as well as on other walls enclosing the plasma existing in the area. In this case large gas losses result. Finally it is also disadvantageous that sometimes from the electrodes further walls in the reactor vessel, coating materials deposited there break off and fall on the workpiece, where they cause undesired defects.

In order to find a remedy against the above disadvantage in U.S. Pat. No. 4,909,183 is proposed to arrange the anodically connected substrate bodies next to each other on a circular track at a distance from the reactor wall and, in the center of the reactor, to arrange cathodes connected with the high-frequency source. The reaction gas is supposed to flow in through an inlet opening in the reactor shell. The substrate bodies are located on a multitude of rotary drives which can insure a satisfactory coating of the substrates.

U.S. Pat. No. 4,991,542 also describes a reaction chamber in whose center a substrate body connected to a high-frequency voltage source is arranged, on whose sides diametrically opposed electrodes are provided, which at the same time serve as gas-supply devices. The electrodes are funnel-shaped and have on the side facing the substrate several gas outlet openings in the approximate shape of a shower head. Instead of connecting the voltage source with the substrate support, these can also be connected with grid electrodes, each arranged on both sides between the substrate and the shower-head electrode.

The EP-A-0 149 408 describes a device for low-temperature coating with a housing having a cage at its inner shell, which is supposed to enclose magnetically the plasma formed inside the housing. A glow filament arranged in the inner cage space serves to excite the plasma; the walls of the housing represent an electrode for producing plasma.

The DE-A-34 17 192 describes a device for forming an amorphous silicon film on a substrate. Between a substrate body and a counterelectrode a plasma is produced, which is surrounded by a cylindrical net structure. The latter is supposed to prevent radicals from expanding outside the net structure. The net structure is supposed to be arranged at a distance from the circumference of the object to be coated which is shorter than the average free path length of the electrons present in the plasma production area.

However, all heretofore-described processes, respectively devices, could yield only unsatisfactory results regarding the coating uniformity of the substrate bodies.

OBJECT OF THE INVENTION

It is therefore the object of the present invention to provide a process and a device which avoid these drawbacks.

SUMMARY OF THE INVENTION

These objects are achieved in a process for coating of substrate bodies with hard substances by using a corona effect activated CVD process at temperatures above 300° C. and pressures below 10000 Pa, in a cage surrounding the substrate body or bodies on all sides and through whose inner space an appropriate reactive gas mixture is passed. On the inner cage surface facing the substrate body a corona discharge is produced and the substrate body is electrically conductive and connected with the voltage source producing the corona discharge.

According to this in a cage surrounding the substrate body or bodies on all sides, on the surface facing the substrate body a contiguous corona discharge is generated, while a reactive gas mixture suitable for the formation of the layer of hard substances is passed through the inner cage space. Basically in this way the substrate body to be coated forms the center of the cage. This center is particularly surrounded by a spherically symmetric corona discharge. The substrate body is connected electrically conductively with the voltage source producing the corona discharge at the cage, i.e. the substrate is connected to the cathode potential (of the cage). The cage also prevents a preferred flow direction of the reactive gas or a favored deposition location of the reaction products from being formed in the coating. The cage structure solves especially the problem of even distribution of the reactive gas over the entire inner cage space.

The corona discharge on the inner cage surface can be produced by a pulsed direct current and the substrate body can be heated to temperatures up to 1100° C., preferably between 400° to 600° C.

Preferably the corona discharge on the inner cage surface is produced by a pulsed direct current, which can show the characteristic particularly described in the DE 38 41 731. The substrate body is heated to temperatures of maximum 1100° C., however it is preferred that the temperature ranges between 400° and 600° C. The set pressures should amount to at least 100 Pa to 1000 Pa in the reaction vessel.

The system for carrying out the process can comprise a reaction vessel provided with at least one gas inlet and at least one gas outlet connected with a pump, in whose inner space at least one cage designed as an electrode and connected to a voltage source is arranged. The cage surrounds the substrate body or bodies on all sides, whereby the substrate body or bodies are connected electrically conductively with the voltage source producing the corona discharge at the cage. The electrode is thus designed like a cage surrounding the substrate body or bodies on all sides, preferably this cage being substantially spherical. The substrate body is connected electrically conductively with the voltage source producing the corona discharge at the cage.

As noted, the cage can be substantially spherical. The cage can have a perforation degree, i.e. a ratio of the openings to the total inner cage surface of 10% to 60%, preferably 30% to 40%. The ratio of the perforated inner surface of the cage to the surface of the substrate body or the substrate bodies can be greater than 4. The ratio of the inner surface of the cage covered by the corona discharge to the surface of the substrate body or substrate bodies can be greater than 4 and the surfaces to be coated of the substrate body or bodies can be arranged at a distance of at least 5 mm, preferably 10 mm or more, from the inner cage surface.

According to a concrete embodiment of the invention the case has a perforation degree of 10% to 60%; this represents the proportion of the openings to the entire inner cage surface. Preferably however the perforation degree equals 30% to 40%. The defined perforation degree of the cage has an influence on the result of the coating. If it is too small, the inflow of the reaction gas into the cage is impaired. However if it is too large, then the cathodic surface for the formation of the corona discharge at the inner cage surface is relatively too small. In this case the density of activated molecules in the reaction gas also decreases, and as a consequence so does the growth rate of the layer of hard material forming on the substrate.

Further it has been found that a favorable dimensioning of the inner cage surface results when the ratio of the cage surface covered by the corona discharge to the surface of the substrate body or to the total surface of the substrate bodies is greater than 4. Alternatively thereto the ratio of the perforated inner cage surface to the mentioned surface or total surface can be selected to be bigger than 4.

The surfaces of the substrate body or bodies to be coated should be located at a minimum distance of 5 mm from the inner cage surface, in order to avoid shadings. In each cage one or more substrate bodies can be arranged. Preferably the gas feeding line or lines and/or the openings directed towards the cage inside are oriented so that the inflowing gas is directed towards the inside of the cage. Also in this case the gas flowing into the cage should not have any preferred flow direction.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
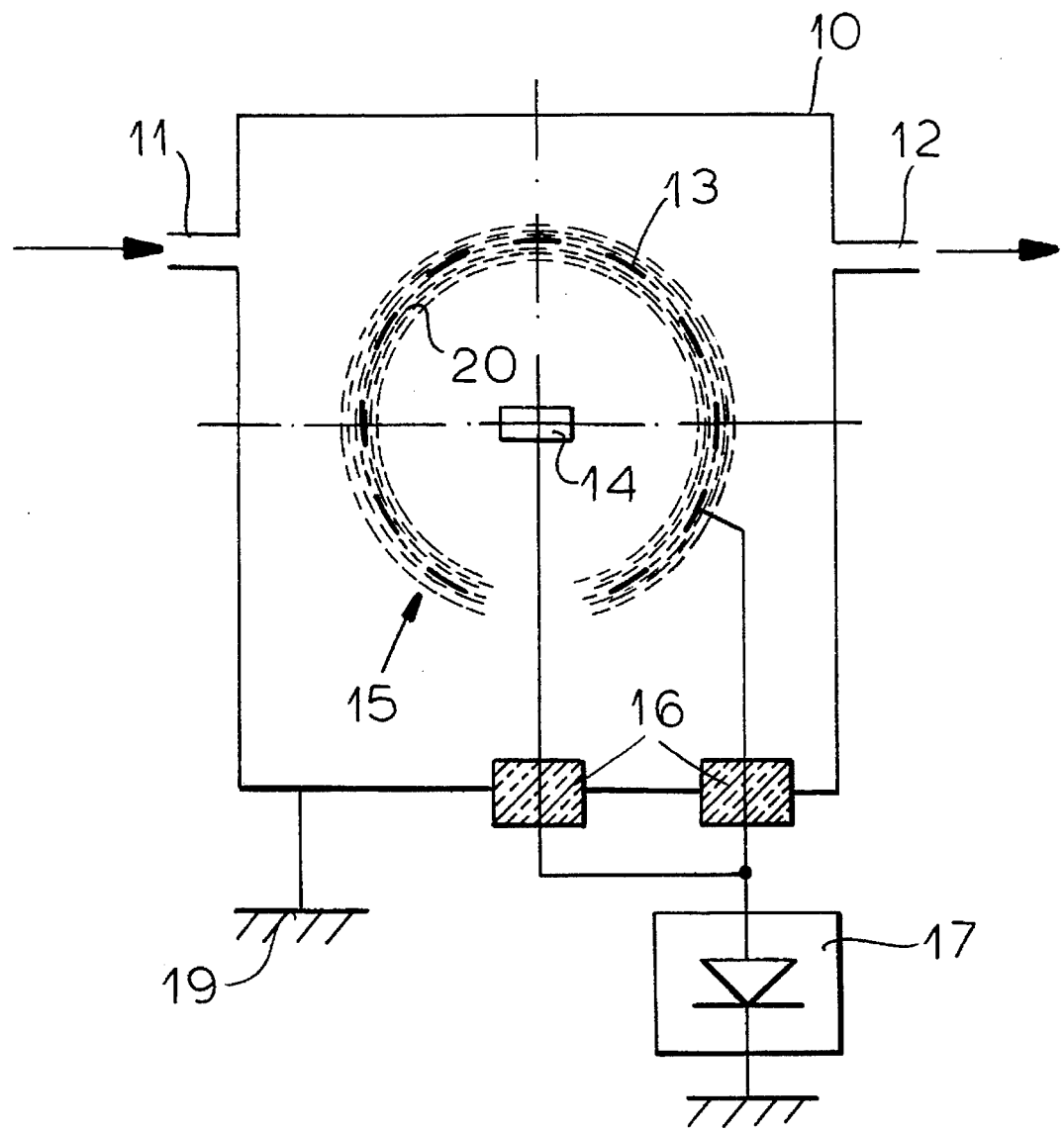
FIGS. 1 and 2 are respective schematic representations of a device according to the invention.

This device consists basically of a reaction vessel 10, which serves as an external vessel and has at least one gas inlet 11, as well as at least one gas outlet 12. Optionally the reaction vessel 10 can be additionally heated by an external heating device not shown in the drawing, when the heat released by the corona discharge is not sufficient to bring the substrate body 14 to a certain temperature.

Figure 3:
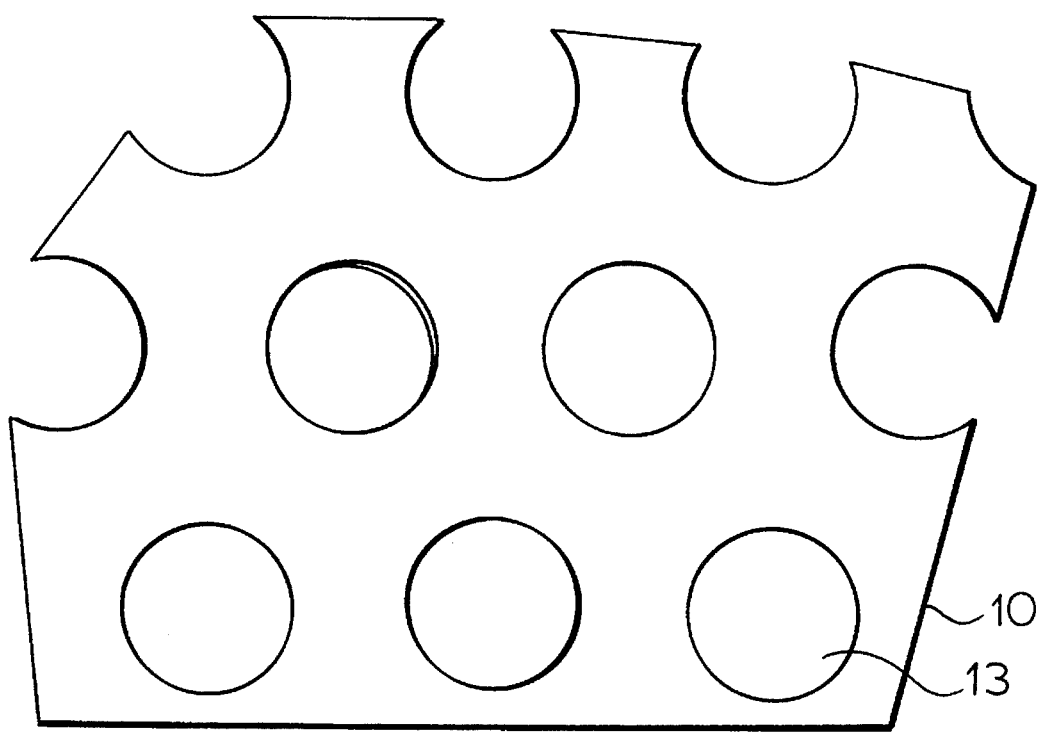
FIG. 3 is a portion front view of the cage.

In the center of the reaction vessel, there is a spherical cage 13, which surrounds the substrate body 14 to be coated on all sides, but allows the reaction gases to flow into the cage without obstruction via inlet openings 15. The area defined by the inlet openings 15 equals approximately 30% to 40% in proportion to the total area of cage 13. In the present case and as shown in FIG. 3 by a section of the cage 13, an advantageous perforation degree of 33% was selected.

In the embodiment of FIG. 1 the substrate body 14 and the cage 13 are connected as cathodes, whereby the corresponding supply lines lead through insulators 16 to the voltage source 17. The reaction vessel 10 is connected to ground at 19 and therefore forms the anode.

The voltage supplied by the voltage source 17 is set so that at a fixed predetermined pressure a cup-like corona discharge 20 is created all the way around the substrate body, as shown in FIG. 1. For completion's sake it has to be mentioned that in the described arrangements a corona discharge is also created at the outer surfaces of cage 13. However in order to achieve a uniform layer thickness on the substrate body 14 it is necessary that the corona discharge 20 be present on the inside of cage 13, i.e. on the surfaces facing the substrate body 14.

In order to obtain sufficiently high growth rates of more than approximately 1 μm per hour with the above arrangements, the ratio of the inner surface of cage 13 covered by a corona discharge 20 to the surface of the substrate body or substrate bodies 14 should be selected to be higher than 4.

Figure 2:
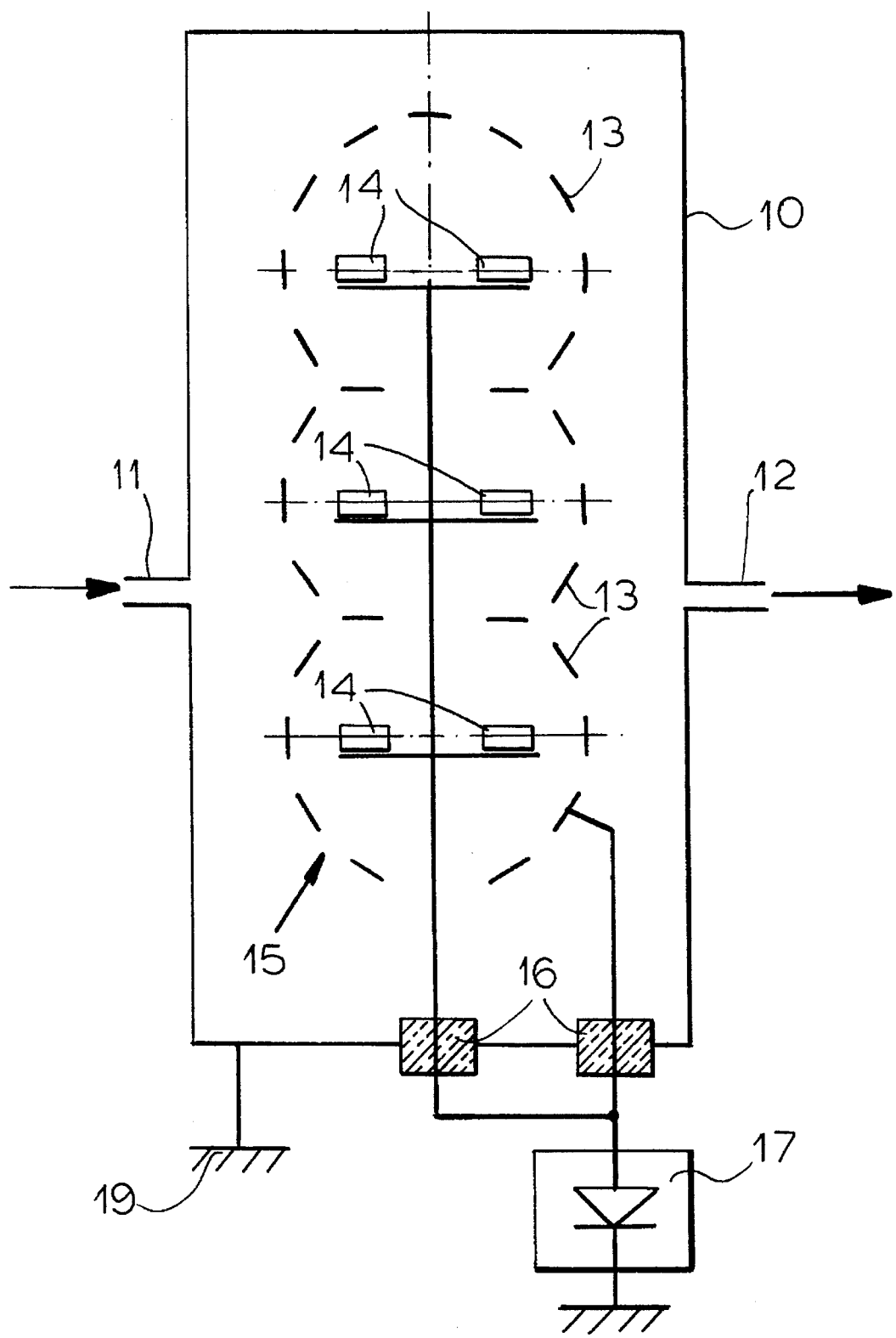

In a further embodiment of the invention according to FIG. 2 it is provided that in the reaction vessel 10 several interconnected cages are arranged. This way the lodging capacity for substrate bodies 14 to be coated can be increased in a simple manner. From FIG. 2 can be further seen that per cage 13 also several substrate bodies arranged next to each other or on top of each other can be provided and coated at the same time.

What is claimed is:

1. A method of coating at least one substrate body by a corona-activated CVD process at a temperature above 300° C. and a pressure below 10,000 Pa comprising the steps of:
   (a) supporting the at least one substrate body in a reaction vessel in all-around spaced relationship from walls thereof;
   (b) surrounding said at least one substrate body on all sides in a cage provided with thoroughgoing perforations, said cage being spaced from said walls and from said at least one substrate body;
   (c) generating along at least an inner surface of said cage a corona discharge by connecting said cage with a voltage source;
   (d) passing a reactive gas mixture through said reaction vessel capable of depositing a coating on said at least one substrate body whereby said gas mixture passes through said cage to said at least one substrate body; and
   (e) electrically connecting said body to said source whereby said coating is deposited on said at least one substrate body.

2. The method defined in claim 1 wherein said at least one substrate body is enclosed in said cage, said cage being spherical.

3. The method defined in claim 1 wherein said corona discharge is produced at said inner surface of said cage by applying a pulsed direct current thereto.

4. The method defined in claim 1, further comprising the step of heating said at least one substrate body to a temperature up to 1100° C.

5. The method defined in claim 4 wherein said at least one substrate body is heated to a temperature of substantially 400° to 600° C.

6. The method defined in claim 1, further comprising the step of maintaining a pressure in said vessel of substantially 100 Pa to substantially 1000 Pa.

7. An apparatus for forming a coating on at least one substrate body by a corona-activated CVD, said apparatus comprising:
   a reaction vessel having at least one reaction gas inlet and at least one reaction gas outlet for passing a reaction gas through said vessel capable of depositing said coating on said at least one substrate body;
   means in said vessel for supporting said at least one substrate body out of contact with walls of said vessel;
   a perforated cage forming an electrode and completely surrounding said at least one substrate body in said vessel out of contact with said at least one substrate body and said walls of said vessel;
   a voltage source connected to said cage for generating along at least an inner surface thereof a corona discharge, said reaction gas passing through said cage to said at least one substrate body; and
   means for electrically connecting said at least one substrate body with said voltage source whereby said coating is deposited on said at least one substrate body.

8. The apparatus defined in claim 7 wherein said cage is substantially spherical.

9. The apparatus defined in claim 7 wherein said perforated cage has a percentage of perforation area to a total area of said cage of substantially 10% to 60%.

10. The apparatus defined in claim 9 wherein said percentage is substantially 30% to 40%.

11. The apparatus defined in claim 7 wherein said cage has a perforation area in a ratio to the area of said substrate body which is greater than four.

12. The apparatus defined in claim 7 wherein said cage has a ratio of an inner surface area covered by corona discharge to the surface area of said body which is greater than four.

13. The apparatus defined in claim 7 wherein said body is spaced from said cage by a distance of at least 5 mm in all directions.

14. The apparatus defined in claim 13 wherein said distance is greater than 10 mm.

15. The apparatus defined in claim 7 wherein said cage includes a plurality of interconnected enclosures provided within said vessel.

16. The apparatus defined in claim 7 wherein said inlet is configured to direct said gas toward said cage.

* * * * *